(12) United States Patent
Wang et al.

(10) Patent No.: US 10,263,649 B2
(45) Date of Patent: Apr. 16, 2019

(54) FULLY INTEGRATED POWER AMPLIFIER EMPLOYING TRANSFORMER COMBINER WITH ENHANCED BACK-OFF EFFICIENCY

(71) Applicant: Avago Technologies General IP (Singapore) Pte. Ltd., Singapore (SG)

(72) Inventors: Hongrui Wang, San Diego, CA (US); Ali Afsahi, San Diego, CA (US); Vikram Magoon, La Jolla, CA (US)

(73) Assignee: Avago Technologies International Sales PTE. Limited, Singapore (SG)

( * ) Notice: Subject to any disclaimer, the term of this patent is extended or adjusted under 35 U.S.C. 154(b) by 0 days.

(21) Appl. No.: 15/798,304

(22) Filed: Oct. 30, 2017

(65) Prior Publication Data

US 2018/0248571 A1 Aug. 30, 2018

Related U.S. Application Data

(60) Provisional application No. 62/464,328, filed on Feb. 27, 2017.

(51) Int. Cl.
| | | |
|---|---|---|
| *H04B 1/04* | (2006.01) | |
| *H04B 7/005* | (2006.01) | |
| *H04B 1/00* | (2006.01) | |
| *H05K 13/04* | (2006.01) | |
| *H04B 14/06* | (2006.01) | |
| *H03G 3/30* | (2006.01) | |

(52) U.S. Cl.
CPC ............ *H04B 1/04* (2013.01); *H04B 1/0017* (2013.01); *H04B 7/005* (2013.01); *H04B 14/06* (2013.01); *H05K 13/046* (2013.01); *H03G 3/3042* (2013.01); *H04B 2001/0416* (2013.01)

(58) Field of Classification Search
CPC ........ H04B 1/04; H04B 1/0017; H04B 7/005; H04B 14/02; H04B 14/06; H03F 3/19; H03F 3/21; H03F 3/24; H03G 3/3042; H05K 13/046
See application file for complete search history.

(56) References Cited

U.S. PATENT DOCUMENTS

| | | | | |
|---|---|---|---|---|
| 2012/0075019 A1* | 3/2012 | Visser | ........................ | H03F 3/24 330/196 |
| 2016/0072443 A1* | 3/2016 | Mizokami | ................. | H03F 3/19 330/295 |
| 2018/0006618 A1* | 1/2018 | Mohta | ........................ | H03F 3/21 |

* cited by examiner

*Primary Examiner* — Thanh C Le
(74) *Attorney, Agent, or Firm* — Morgan, Lewis & Bockius LLP

(57) ABSTRACT

A fully integrated power amplifier (PA) employing a transformer combiner with enhanced back-off efficiency includes a first PA to amplify a first radio frequency (RF) signal and a second PA to amplify a second RF signal. A first variable capacitor is coupled between differential output nodes of the first PA. A second variable capacitor is coupled between differential output nodes of the second PA. The differential outputs of the first PA and the second PA are coupled via respective first and second transformers to a load. Capacitance values associated with the first and second variable capacitors are dynamically adjustable based on an amplitude of the RF signal to achieve a desired power efficiency at an output power level.

20 Claims, 10 Drawing Sheets

FULLY INTEGRATED POWER AMPLIFIER EMPLOYING TRANSFORMER COMBINER WITH ENHANCED BACK-OFF EFFICIENCY

CROSS-REFERENCE TO RELATED APPLICATIONS

This application claims the benefit of priority under 35 U.S.C. § 119 from U.S. Provisional Patent Application 62/464,328 filed Feb. 27, 2017, which is incorporated herein by reference in its entirety.

TECHNICAL FIELD

The present description relates generally to integrated circuits, and more particularly, to a fully integrated power amplifier employing transformer combiner with enhanced back-off efficiency.

BACKGROUND

Doherty power amplifiers use efficient and linear power amplifier configurations and are often employed to amplify radio-frequency (RF) signals having varying amplitudes. The Doherty power amplifier (PA) configuration generally includes two amplifier sections, the first section, referred to as the carrier PA, can cater for lower amplitude signals, and second section, referred to as the peaking PA, provides the capability to meet the higher power-level conditions (e.g., at a peak power above ~6 dB power back-off) without running into compression. In the Doherty PA configuration, the input power signal is split into two components, each of which is sent to one of carrier PA and the peaking PA. The output signal from the carrier PA is 90° phased shifted (e.g., via a quarter-wavelength transmission-line).

The Doherty PA configuration, although can be readily implemented using on-board transmission-line traces and may be a robust configuration, but may not be a viable choice for integration on a chip. This is because the quarter-wavelength transmission-line may have a large area and may result in an unacceptable substrate loss. Further, the Doherty PA configuration may be difficult to migrate to a differential PA topology.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, methods and configurations are described for providing a fully integrated high bandwidth power amplifier employing transformer combiner with enhanced back-off efficiency. It has been difficult to fully integrate CMOS Doherty power amplifiers with on-chip transmission lines due to large area and high substrate loss. An alternative way to implement a Doherty power amplifier is to employ an on-chip transformer combiner for load modulation. However, the transformer combiner as a non-isolated power combiner can significantly degrade the efficiency, for example, at about 6 dB power back-off. The subject technology uses dynamically variable capacitors to obviate the efficiency degradation of the transformer combiner configuration. The disclosed solution has a number of advantageous features. For example, the transformer combiner PA of the subject technology can be fully integrated on a chip and is compatible with CMOS manufacturing process. Further, the disclosed transformer combiner configuration is a compact solution that can be implemented for differential operation and can provide a substantial (e.g., about 50%) improvement in power efficiency at power levels below the peak power (e.g., at about 6 dB power back-off).

Figure 1:
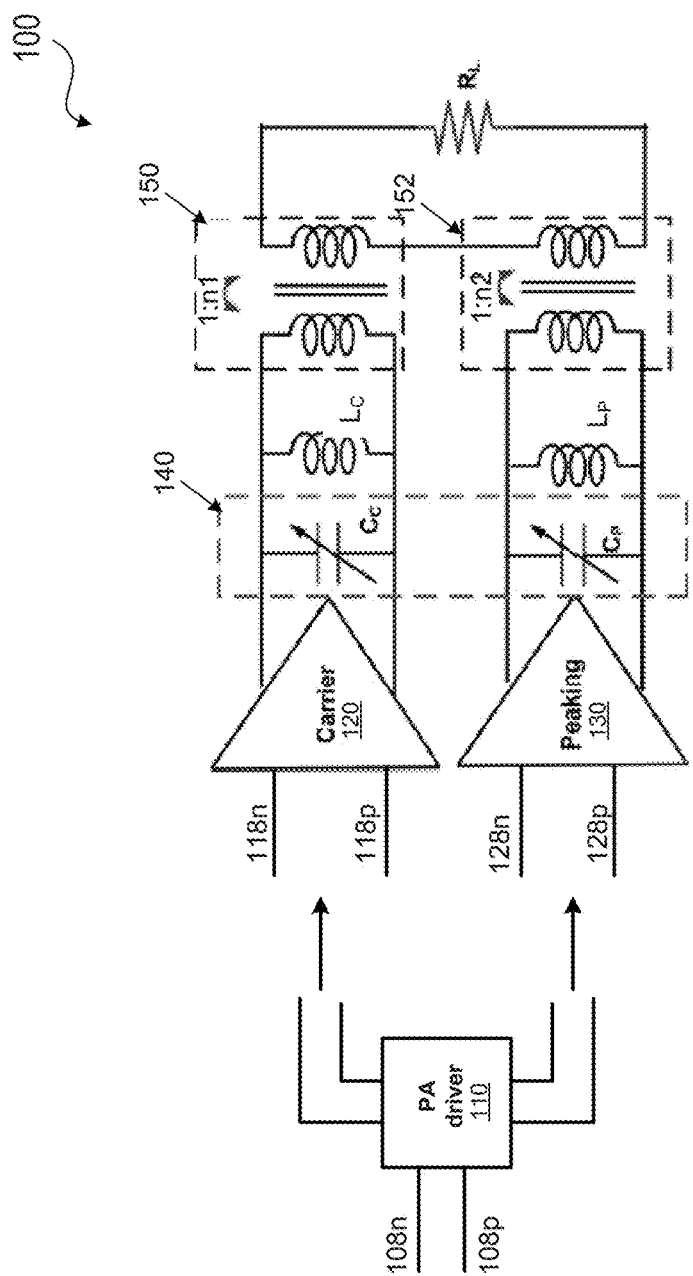
FIG. 1 is a schematic diagram illustrating an example of a fully integrated power amplifier (PA) employing a transformer combiner with enhanced back-off efficiency, according to aspects of the subject technology.

FIG. 1 is a schematic diagram illustrating an example of a fully integrated power amplifier (PA) 100 employing a transformer combiner with enhanced back-off efficiency, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The fully integrated power amplifier (PA) 100 (hereinafter "PA 100") includes a carrier PA 120, a peaking PA 130, a set of capacitors 140, transformers 150 and 152 and a load $R_L$. The carrier PA 120 and the peaking PA 130 are differential input and differential output amplifiers and receive their respective differential input signals 118 (e.g., 118n and 118p) and 128 (e.g., 128n and 128p) from a PA driver 110. The PA driver 110 includes, but is not limited to, a splitter (e.g., a transformer) that can split a differential radio-frequency (RF) input signal 108 (e.g., 108n and 108p) into two differential input signals 118 and 128. In some implementations, the two differential input signals 118 and 128 have some phase difference (e.g., about 90 degrees). The carrier PA 120 is a fixed-bias PA and can amplify the differential input signal 118 (e.g., a carrier signal) to a first level that is less than a peak power. In some implementations, the first power level is, but is not limited to, an approximately 6 dB power back-off level. The peaking PA 130 amplifies the differential input signal 118 (e.g., a modulated signal) to the peak power level. The peaking PA 130 is a variable-bias PA and can be turned off when the output power at the load $R_L$ is less than the first power level (e.g., below ~6 dB power back-off level).

The set of capacitors 140 includes variable capacitors $C_C$ and $C_P$, which are a part of the features of the subject technology and are coupled between output nodes of the carrier PA 120 and the peaking PA 130, respectively. In some implementations, the variable capacitors $C_C$ and $C_P$ are adjusted based on an envelope of the differential RF input signal 108, as will be discussed in more detail herein. The inductors L represent the self-inductance of the transformers 150 and 152 as seen from the output nodes of the carrier PA 120 and the peaking PA 130. The transformers 150 and 152 can have turn ratios of 1/n1 and 1/n2, where n1 and n2 are an integer numbers typically larger than 1, and are associated with the number of turns of the secondary coils (e.g., on the load side) of the transformers 150 and 152. The variable capacitors $C_C$ and $C_P$ may include internal capacitors associated with the output nodes of the carrier PA 120 and the peaking PA 130.

Figure 2:
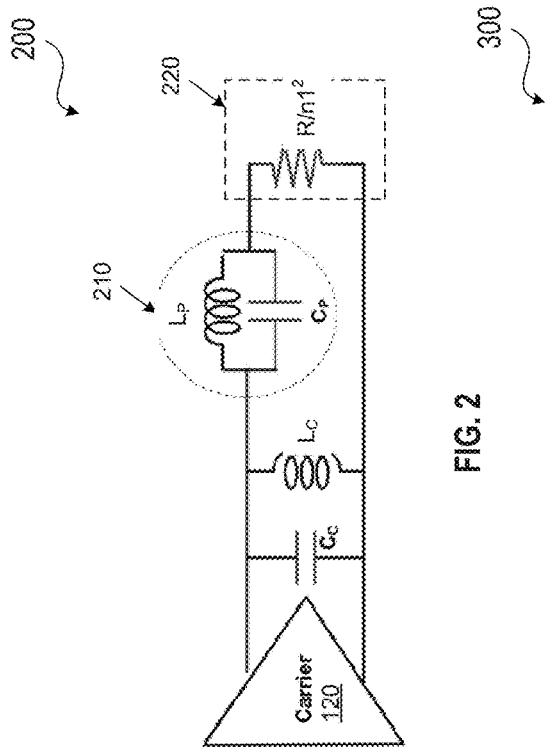
FIG. 2 is a schematic diagram illustrating an example of an equivalent circuit model of the PA of FIG. 1 when the peaking power amplifier is off, according to aspects of the subject technology.

FIG. 2 is a schematic diagram illustrating an example of an equivalent circuit model 200 of the PA 100 of FIG. 1 when the peaking power amplifier is off, according to aspects of the subject technology. As mentioned above, when the output power at the load $R_L$ of the PA 100 drops below the first power level (e.g., ~6 dB power-back off level), the peaking PA 130 of FIG. 1 is turned off. The equivalent circuit 200 corresponds to the PA 100, while the peaking PA 130 is off. In the equivalent circuit model 200, the transformers 150 and 152 are not shown as the load $R_L$ is replaced with a equivalent load 220 (e.g., a reflected load $R_L/n1^2$) as seen from the primary side of the transformer 150, and the parallel combination 210 of $C_P$ and $L_P$ associated with the peaking PA 130 are shown in series with the equivalent load 220 (e.g., $R_L/n1^2$). The $C_C$ and $C_P$ as used in FIG. 2 are only representative of the internal capacitances of the carrier PA 120 and the peaking PA 130 and resonate with the inductors LC and $L_P$ at an operating frequency (e.g., up to about 6-7 GHz). The resonance at the operating frequency turns the parallel combination 210 into an undesired approximately open circuit (e.g., a substantially high impedance) at the first power level (e.g., ~6 dB power back-off level), which can drastically reduce the power efficiency of the PA 100. It is understood that the $C_C$ and $C_P$ as used in FIG. 2 may not include capacitance contributions form variable capacitors of the subject technology. In order to mitigate this problem, the subject solution introduces variable capacitances as shown in FIG. 1 and derives optimal values for the capacitances $C_C$ and $C_P$ (from now on including the variable capacitors of the subject technology) at the peak power and at the first power level. For example, the optimal value for the capacitances $C_C$ and $C_P$ at the peak power (e.g., saturation) are expressed as:

$$C_C = C_P = (1/\omega^2 L) \tag{Eq. 1}$$

Where, $L = L_P = L_C$ and the optimal value for the capacitances $C_C$ and $C_P$ at the first power level (e.g., ~6 dB power back-off level), can be expressed as:

$$C_C = (1/\omega^2 L) + L/((R_L/n^2) + \omega^2 L^2) \text{ and } C_P = 0, \tag{Eq. 2}$$

Where ω is the operating frequency.

Figure 3:
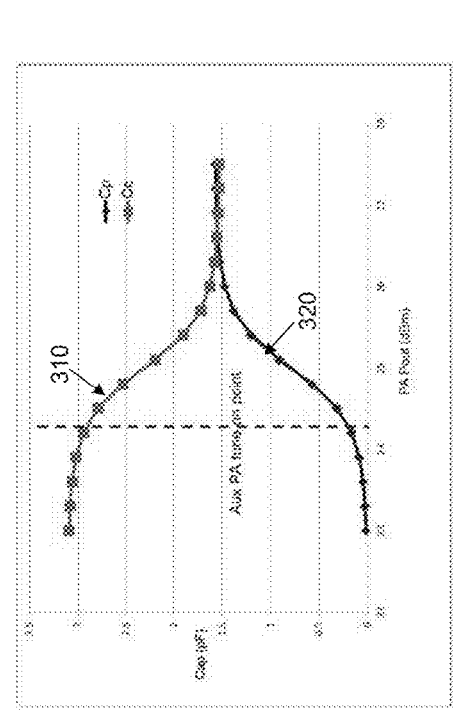
FIG. 3 is a chart illustrating an example plot of variation of capacitance values of variable capacitors as a function of PA output power, according to aspects of the subject technology.

FIG. 3 is a chart 300 illustrating example plot 310 and 320 of variation of capacitance values of variable capacitors as a function of PA output power, according to aspects of the subject technology. The plot 310 and 320 depict variation of capacitance values $C_P$ and $C_C$, as expressed in Eq. 1 and Eq. 2 above. At power values corresponding to the peak power, the optimal capacitance values (Eq. 1) are equal. At the first power level, the optimal capacitance values deviate from each other and the value for $C_P$ is approximately equal to zero, whereas the value for $C_C$ grows with lowering the power level and is optimal (e.g., as in Eq. 2) at the first power level.

Figure 4A:
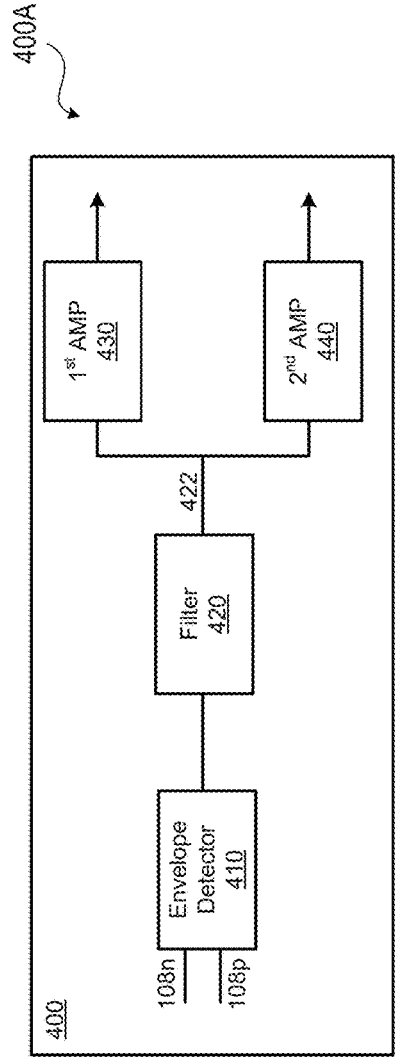
FIGS. 4A-4B are a block diagram and a schematic diagram illustrating an example of a control circuit for adjusting variable capacitors of the PA of FIG. 1, according to aspects of the subject technology.
Figure 4B:
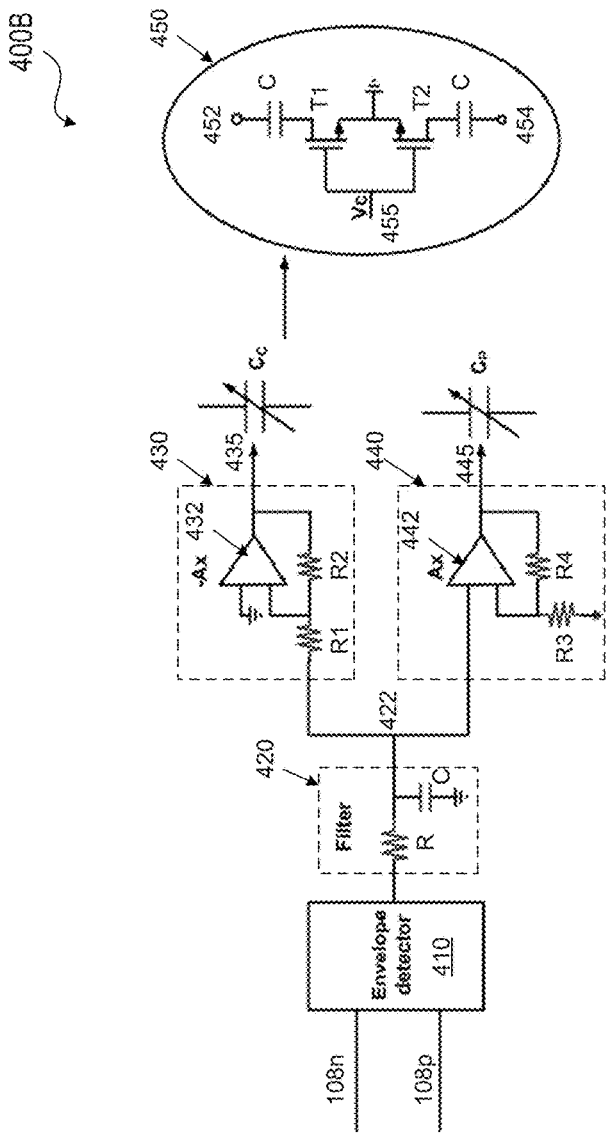

FIGS. 4A-4B are a block diagram and a schematic diagram illustrating an example of a control circuit 400 for adjusting variable capacitors of the PA 100 of FIG. 1, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The control circuit 400 includes an envelope detector 410, a filter 420, a first amplifier 430 and a second amplifier 440. The envelope detector 410 can generate an envelope signal using the differential RF input signal 108 (e.g., 108n and 108p) of the PA driver 110 of FIG. 1. The envelope signal is an envelope of the differential RF input signal 108, which is then passed to the filter 420 for further smoothing. The envelope detector 410 is a known circuit and the filter 420 can be a known low-pass filter. The filtered envelope signal is then fed at a node 422 into the first and second amplifiers 430 and 440 for further amplifications.

In one or more implementations, the control circuit 400 cab be implemented as shown in the schematic diagram 400B. The first amplifiers 430 can be implemented using an operational amplifier 432 and resistors R1 and R2 to provide a voltage gain equal to R2/R1. The second amplifiers 440 can be implemented using an operational amplifier 442 and resistors R3 and R4 to provide a voltage gain equal to (1+R4/R3). The output signal 435 of the first amplifier 430, which is proportional to the envelope signal, controls the variable capacitor $C_C$ associated with the carrier PA 120 of FIG. 1. The output signal 445 of the second amplifier 440, which is also proportional to the envelope signal, can control the variable capacitor $C_P$ associated with the peaking PA 130 of FIG. 1.

In some implementations, each of the variable capacitor $C_C$ and $C_P$ can be implemented with a circuit 450. The circuit 450 includes transistors (e.g., NMOS) T1 and T2 and capacitors C and provides a variable capacitance between nodes 452 and 454. Each node 435 or 445 can see a capacitor C coupled to the ground potential when the control signal Vc (e.g., equal to output signal 435 or 445) applied to a common gate terminal 455 of the transistors T1 and T2 is high (e.g., high enough to saturate transistors T1 and T2), and can see almost zero capacitance to the ground potential when the control signal Vc is low (e.g., $<V_T$). For values between the low and high the transistors T1 and T2 are equivalent to impedances, the value of which depends on Vc, and makes the variable capacitance (e.g., between 452 and 454) different for different values of Vc.

In some implementations, the smooth envelope signal at the node 422 is used as a variable bias for the peaking PA 130 of FIG. 1. The variable bias is to enable turning the peaking PA 130 off when the output power drops below a certain level, for example, approximately below the 6 dB power-back off level to enhance power efficiency of the PA 100. It is understood that the carrier PA 120 is always active and is not turned off based on output power level.

Figure 5:
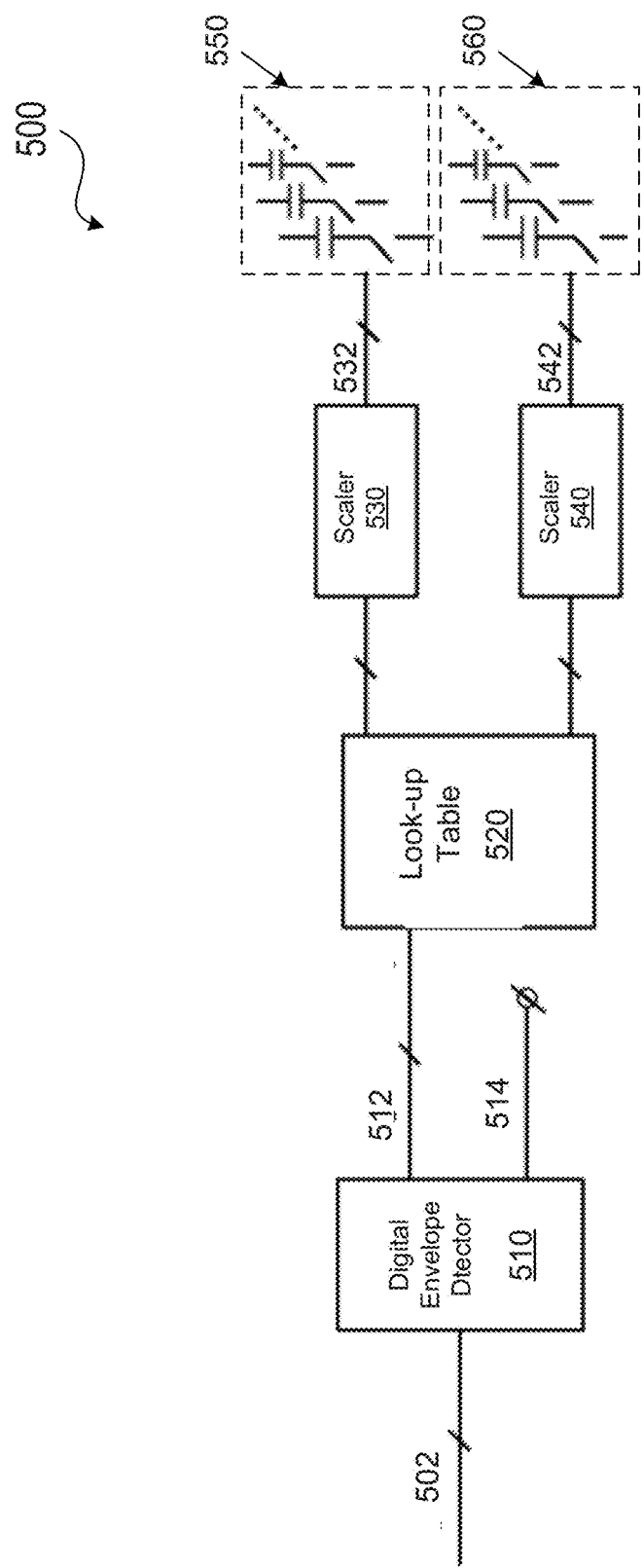
FIG. 5 is a schematic diagram illustrating an example of a digital control circuit for adjusting variable capacitors of the PA of FIG. 1, according to aspects of the subject technology.

FIG. 5 is a schematic diagram illustrating an example of a digital control circuit 500 for adjusting variable capacitors of the PA 100 of FIG. 1, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The digital control circuit 500 includes a digital envelope detector 510, a look-up table 520, scalers 530 and 540 and variable capacitors 550 and 560. The digital envelope detector 510 provides a digital envelope 512 of a digital baseband signal 502. The digital baseband signal 502 is typically an in-phase (I) and quadrature (Q) signal, and the digital envelope detector 510 provides the digital envelope 512 and a digital phase 514 of the I and Q signal. In some implementations, the digital envelope detector 510 can be implemented using a known coordinate-rotation digital computer (CORDIC). CORDIC uses simple shift-add operations for a number of computing tasks such as the calculation of trigonometric, hyperbolic and logarithmic functions. The look-up table 520 generates a number of (e.g., N) bits based on the digital envelope. The number N of bits generated by the look-up table 520 may not be suitable for controlling the variable capacitors 550 and 560, each of which is realized, for example, by using a bank of switched-capacitors. The scalers 530 and 540 can convert the number N of bits generated by the look-up table 520 to the suitable number (e.g., M) of bits associated with digital signals 532 and 542, which control the variable capacitors 550 and 560.

The variable capacitors 550 and 560 represent the variable capacitors $C_C$ and $C_P$ of FIG. 1 and are implemented by banks of switched-capacitors, the capacitances of which are controlled by the digital signals 532 and 542 based on the digital envelope of the digital baseband 502.

Figure 6:
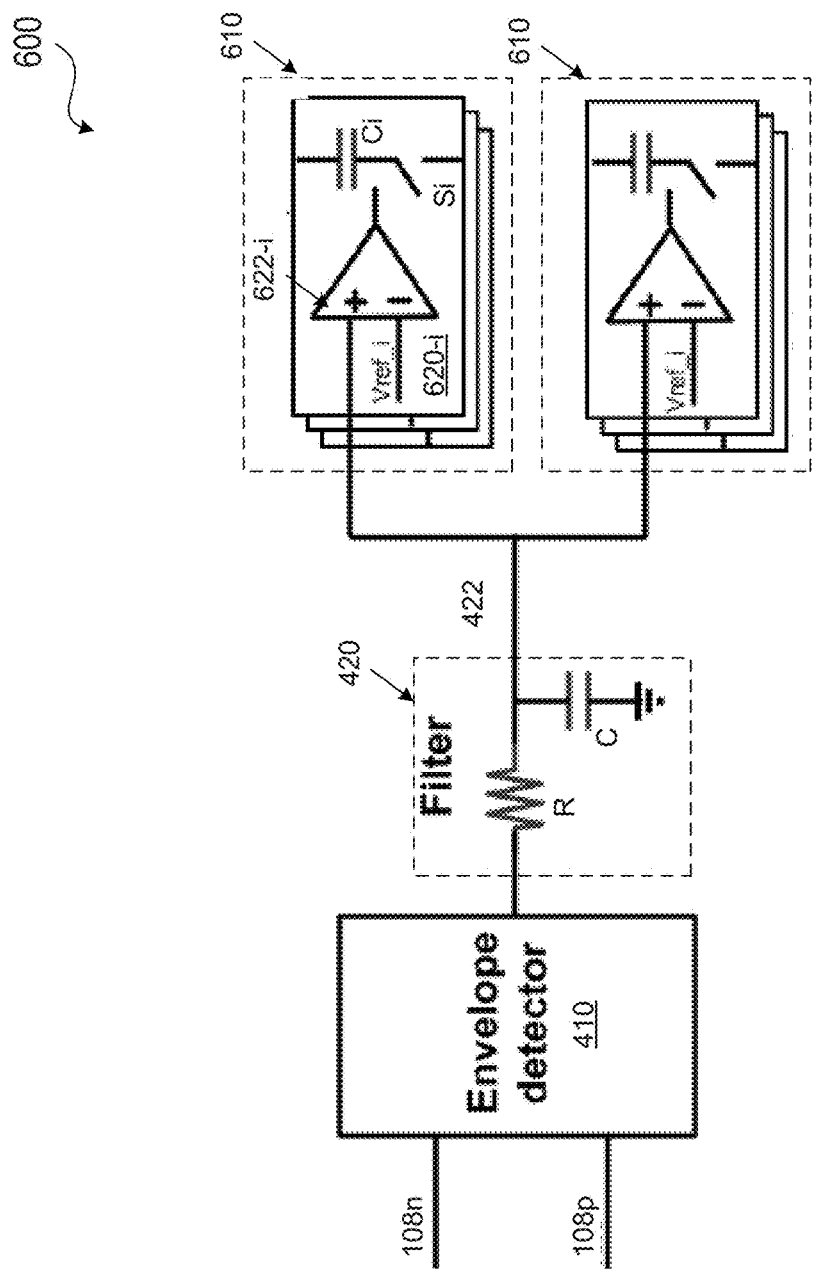
FIG. 6 is a schematic diagram illustrating an example of a hybrid control circuit for adjusting variable capacitors of the PA of FIG. 1, according to aspects of the subject technology.

FIG. 6 is a schematic diagram illustrating an example of a hybrid control circuit 600 for adjusting variable capacitors of the PA 100 of FIG. 1, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The hybrid control circuit 600 is a combination of the analog control circuit 400 of FIG. 4 and the digital control circuit 500 of FIG. 5. The hybrid control circuit 600 includes the envelope detector 410, the filter 420 and capacitor tuning circuits 610. The envelope detector 410 can generate an envelope of the differential RF input signal 108 (e.g., 108n and 108p), as discussed with respect to FIG. 4, and the filter 420 is a low pass filter that smoothen the envelope signal and generate a smooth envelope signal at the node 422. The capacitor tuning circuit 610 operates on an implementation of the variable capacitors $C_C$ or $C_P$ of FIG. 1. The capacitor tuning circuit 610 includes a number (e.g., M) of similar sub-circuits 620 (e.g., 620-1 ... 620-$i$ ... 620-M), of which the sub-circuit 620-$i$ is described herein. The sub-circuit 620-$i$ includes a comparator 622-$i$, a capacitor Ci and a switch Si. The comparator 622-$i$ compares the filtered envelope signal with a reference voltage Vref_i and controls a state of the switch Si based on the comparison result. Each comparator 622-$i$ uses a different reference voltage, such that the number of capacitors Ci that are coupled to contribute to the capacitance values of the variable capacitors $C_C$ or $C_P$ depend on the envelope signal. The hybrid control circuit 600 is suitable for applications that digital baseband processing is not available.

Figure 7:
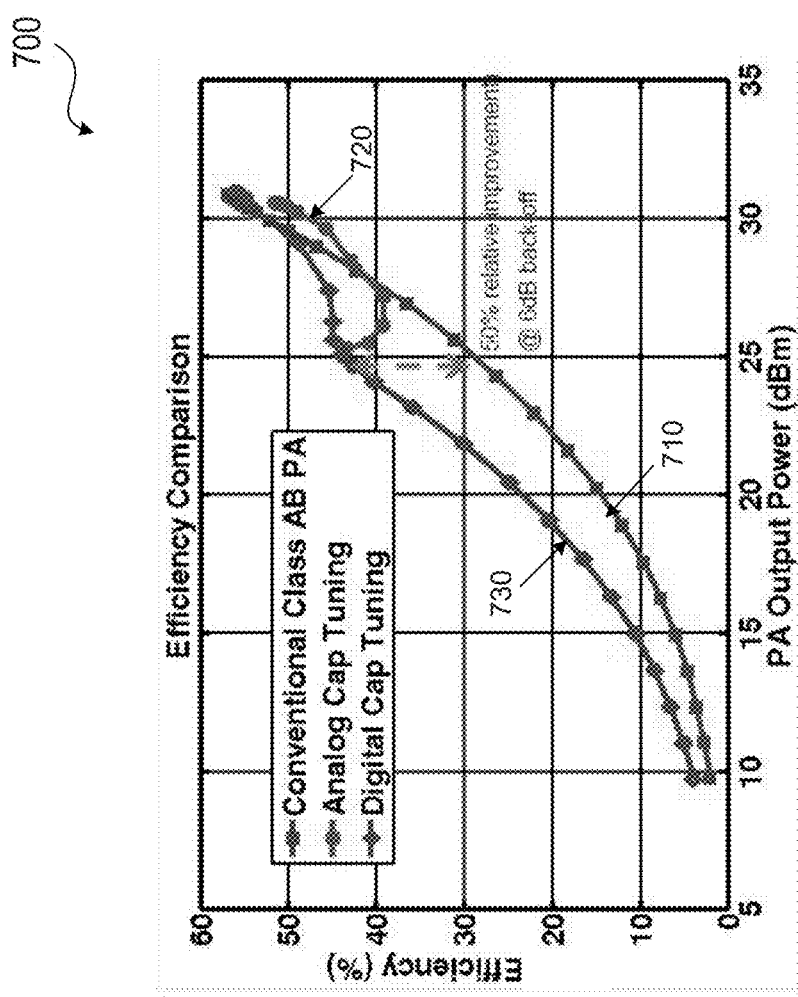
FIG. 7 is a chart illustrating examples of efficiency plots for various adjustment methods of variable capacitors of the PA of FIG. 1, according to aspects of the subject technology.

FIG. 7 is a chart 700 illustrating examples of efficiency plots 710, 720 and 730 for various adjustment methods of variable capacitors $C_C$ or $C_P$ of the PA 100 of FIG. 1, according to aspects of the subject technology. The efficiency plot 710 shows variation of the power efficiency of a conventional carrier PA (e.g., a class AB PA) versus PA output power (dBm). The efficiency plots 720 and 730 correspond to PAs of the subject technology with analog and digital capacitor tuning, respectively. The analog and digital capacitor tuning can be respectively performed, for example, by the analog control circuit 400 of FIG. 4 and the digital control circuit 500 of FIG. 5. The efficiency plots 720 and 730 coincide below about 6 dB power-back off point and show deviations after that point, at which the peaking PA (e.g., 130 of FIG. 1) is turned on. The digital cap tuning shows to be more efficient when the peaking PA is turned on. At the power levels below the 6 dB power-back off, the power efficiencies of the digital and analog capacitor tuned PAs of the subject technology (e.g., represented by plots 720 and 720) are superior to the power efficiency of the conventional class AB PA (e.g., represented by plot 710).

For example, at the 6 dB power-back off, the power efficiencies of the digital and analog capacitor tuned PAs of the subject technology show about 50% improvement over the power efficiency of the conventional class AB PA.

Figure 8:
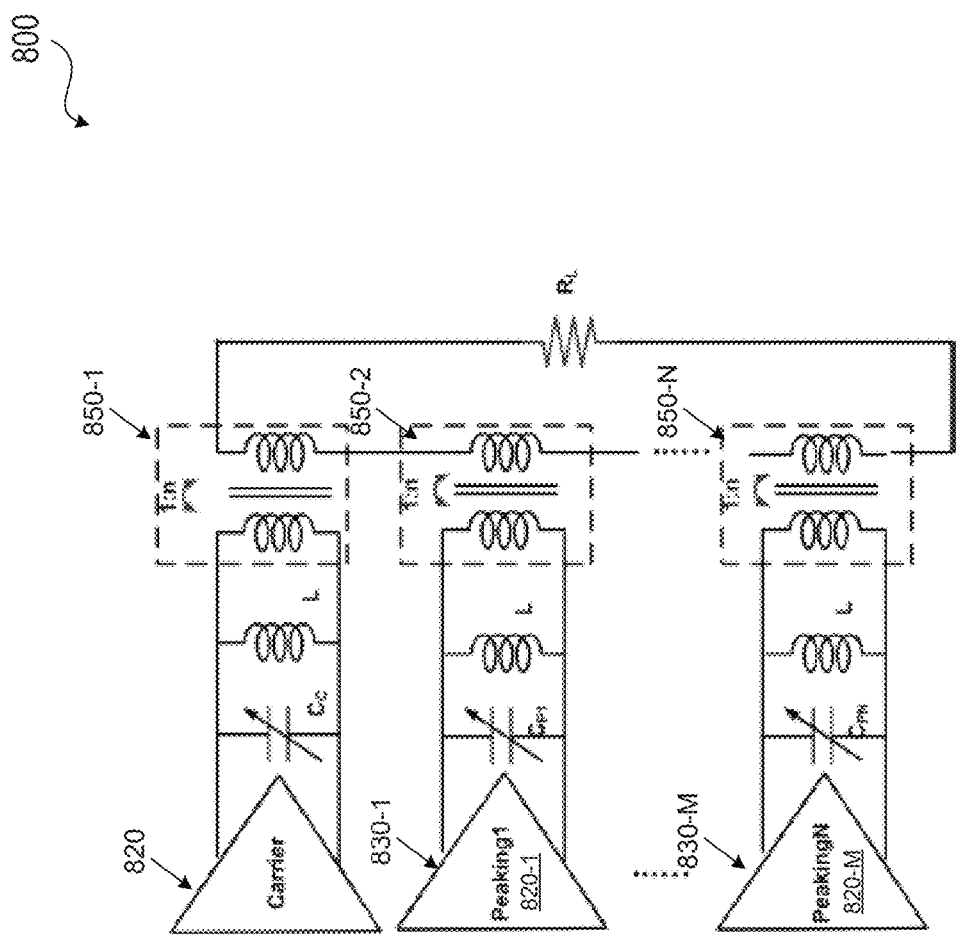
FIG. 8 is a schematic diagram illustrating an example multiple-transformer implementation of the PA of FIG. 1, according to aspects of the subject technology.

FIG. 8 is a schematic diagram illustrating an example multiple-transformer implementation 800 of the PA 100 of FIG. 1, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

In the multiple-transformer implementation 800 shown in FIG. 8, a single carrier PA 820 along with multiple (e.g., M=N−1) peaking PAs 830 (e.g., 830-1 . . . 830-M) are coupled via transformers 850 (e.g., 850-1, 850-2 . . . 850-N) to a load $R_L$. The N-transformer implementation 800 allows power efficiency enhancement at various power levels (e.g., 6 dB, 12 dB . . . 6M dB power back-off). This is because each of the M peaking PAs 830 can be turned off on based on the envelope signal at different power levels (e.g., 6 dB, 12 dB . . . 6M dB power back-off). For example, the peaking PA 830-1 can be on at power levels beyond the 6 dB power-back off, whereas the peaking PA 830-M is on at power levels beyond the 6M dB power-back off.

Figure 9:
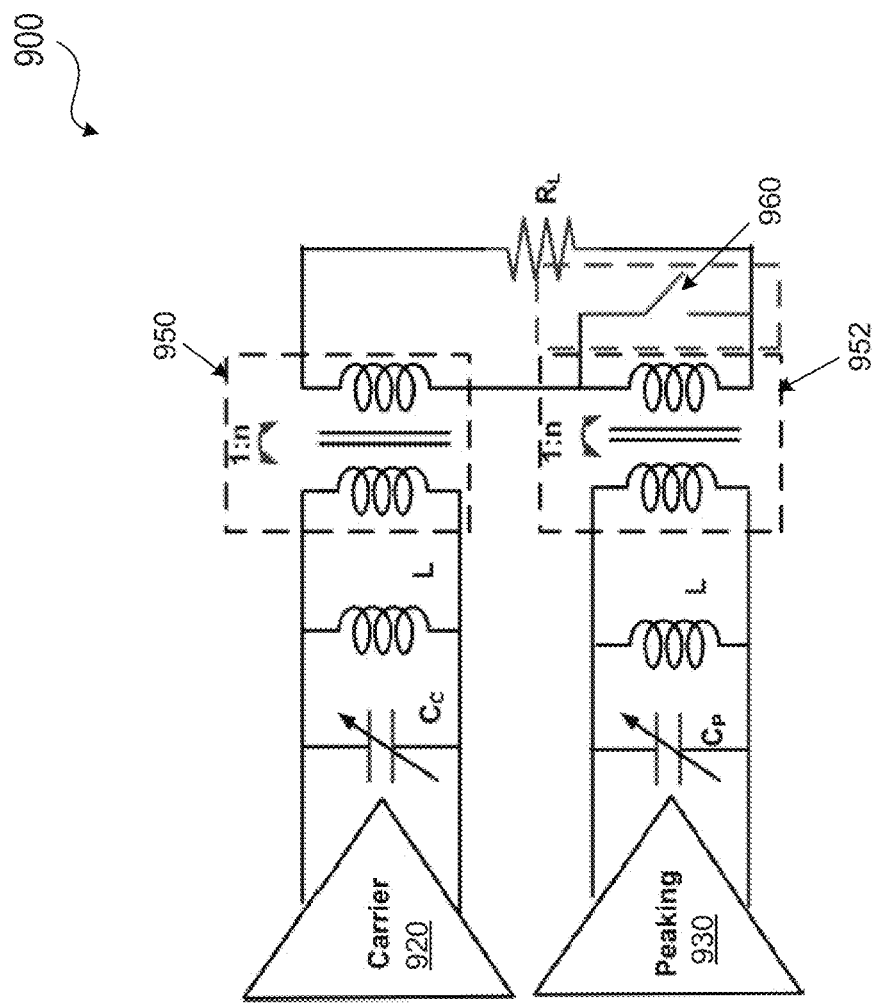
FIG. 9 is a schematic diagram illustrating an example of a fully integrated power amplifier (PA) employing a transformer combiner and a switch with enhanced back-off efficiency, according to aspects of the subject technology.

FIG. 9 is a schematic diagram illustrating an example of a PA 900 employing transformer combiner and a switch 960 with enhanced back-off efficiency, according to aspects of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The PA 900 is similar to the PA 100 of FIG. 1 except for a switch 960. For example, the PA 900 includes a carrier PA 920, a peaking PA 930, the variable capacitors $C_C$ or $C_P$, transformers 950 and 952 and the switch 960. The carrier PA 920 and the peaking PA 930 are similar to a carrier PA 120 and a peaking PA 130 of FIG. 1, respectively. Further, the transformers 950 and 952 are similar to the transformers 150 and 152 of FIG. 1. The switch 960 is coupled in parallel with a secondary coil of the transformer 952 and is operable to short the secondary coil and effectively isolate the peaking PA 930 from the load $R_L$, for example, at output power levels below 6 dB power back-off. In some implementations, the switch 960 can be controlled by an envelope signal as provided, for example, at the node 422 of FIG. 4. The addition of switch 960 can further enhance power efficiency of the PA 900 as it can completely isolate the peaking PA 930 and its associated losses from affecting the power efficiency of the PA 900.

Figure 10:
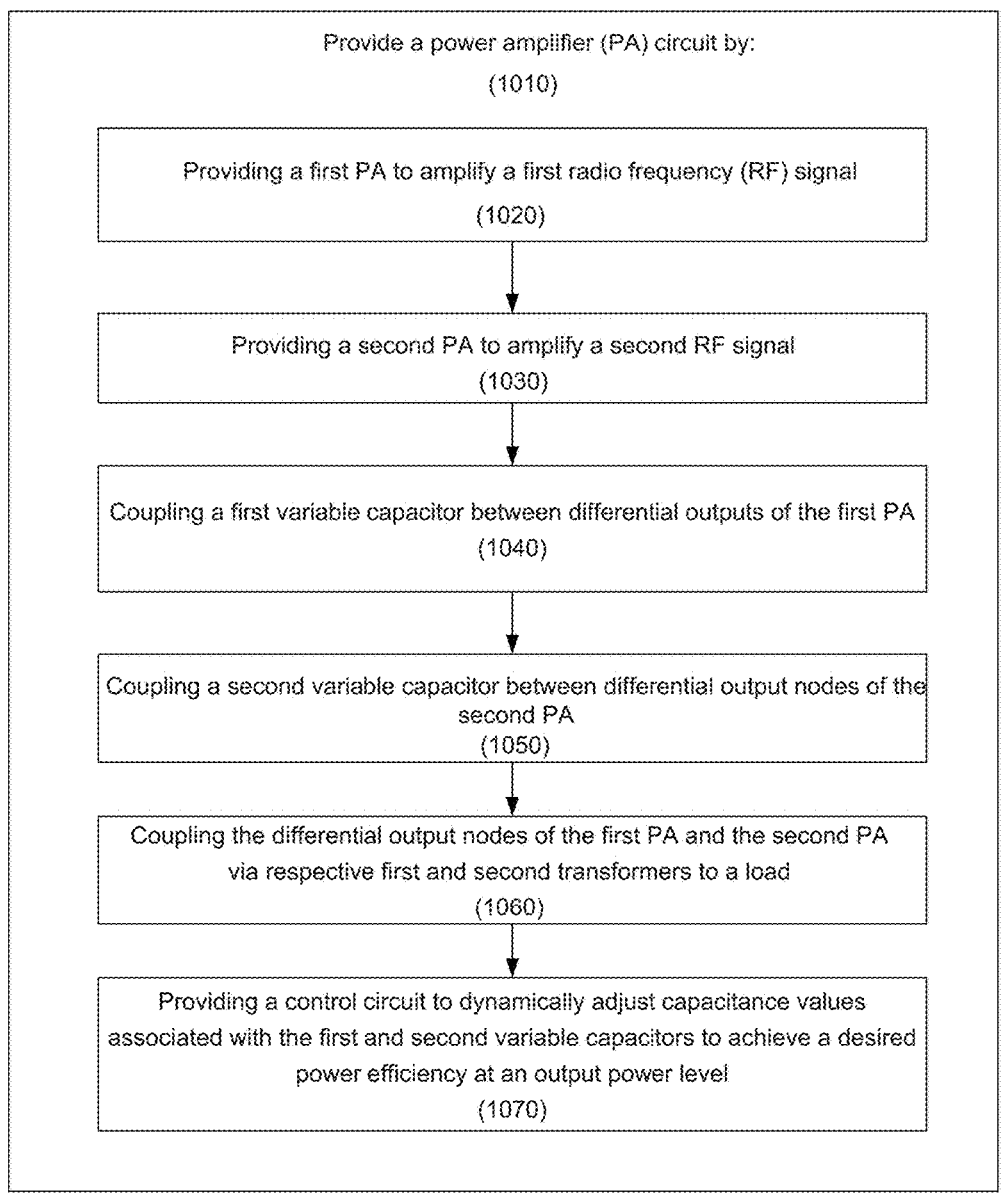
FIG. 10 is flow diagram illustrating a method of providing a fully integrated power amplifier (PA) employing a transformer combiner with enhanced back-off efficiency, according to aspects of the subject technology.

FIG. 10 is flow diagram illustrating a method 1000 of providing a fully integrated power amplifier (PA) employing transformer combiner with enhanced back-off efficiency, according to aspects of the subject technology. For explanatory purposes, the method 1000 is primarily described herein with reference to the PA 100 and analog control circuit 400 of FIGS. 1 and 4. However, the method 1000 is not limited to the PA 100 and analog control circuit 400 of FIGS. 1 and 4, and one or more blocks (or operations) of the method 1000 may be performed by one or more other components of the PA 100 and analog control circuit 400 of FIGS. 1 and 4. Further for explanatory purposes, the blocks of the example method 1000 are described herein as occurring in serial, or linearly. However, multiple blocks of the example method 1000 may occur in parallel. In addition, the blocks of the example method 1000 need not be performed in the order.

The method 1000 includes providing a power amplifier (PA) circuit (e.g., 100 of FIG. 1) (1010) by providing a first PA (e.g., 120 of FIG. 1) to amplify a first radio frequency (RF) signal (e.g., 118 of FIG. 1) (1020). A second PA (e.g., 130 of FIG. 1) is provided to amplify a second RF signal (e.g., 128 of FIG. 1) (1030). A first variable capacitor (e.g., $C_C$ of FIG. 1) is coupled between differential outputs of the first PA (1040). A second variable capacitor (e.g., $C_P$ of FIG. 1) is coupled between differential output nodes of the second PA (1050). The differential output nodes of the first PA and the second PA are coupled via respective first and second transformers (e.g., 150 and 152 of FIG. 1) to a load (e.g., $R_L$ of FIG. 1) (1060). A control circuit (e.g., 400 of FIG. 4) is provided to dynamically adjust capacitance values associated with the first and second variable capacitors to achieve a desired power efficiency at an output power level (1070).

Figure 11:
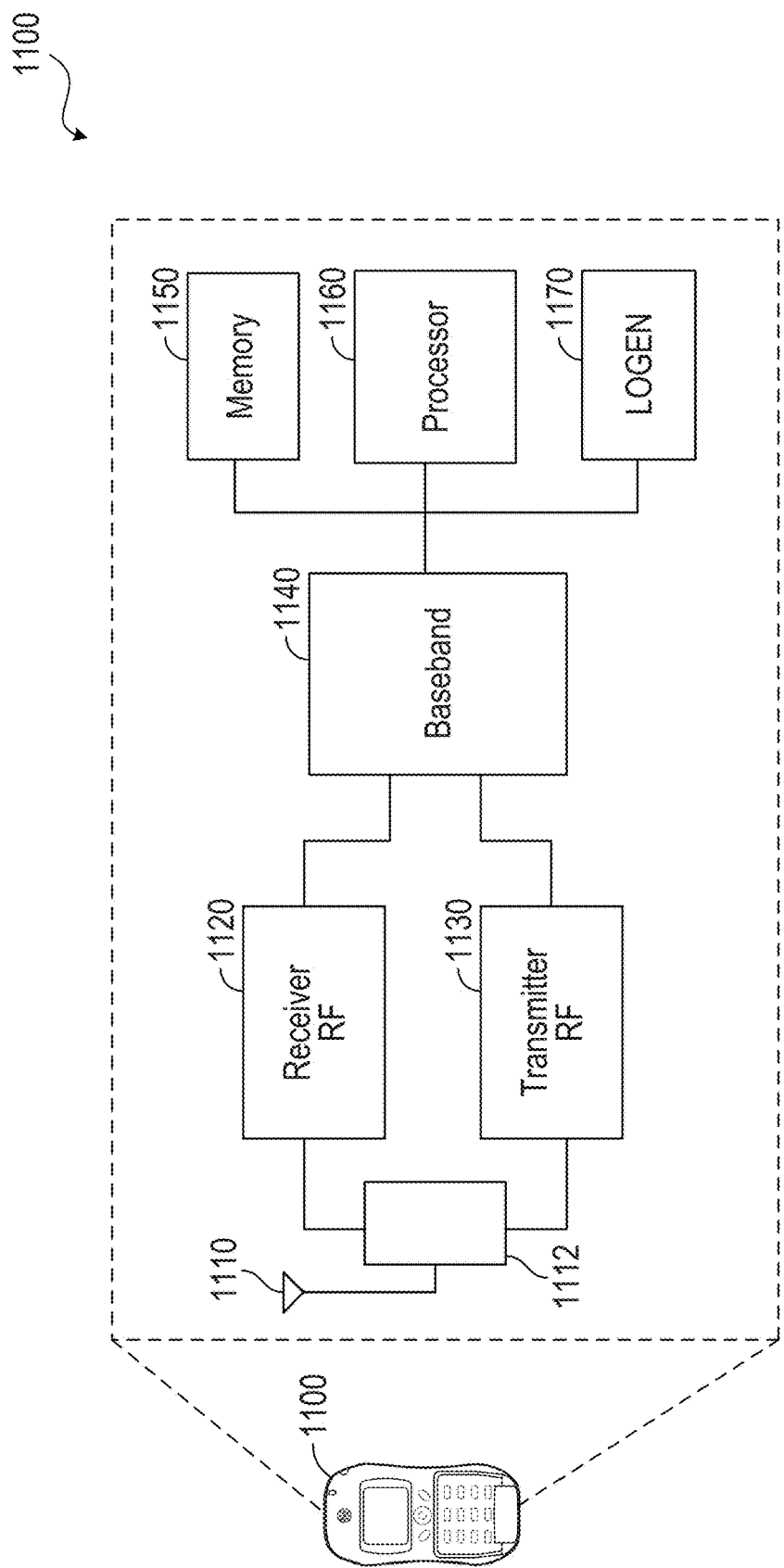
FIG. 11 is a block diagram illustrating an example wireless communication device in accordance with one or more implementations of the subject technology.

FIG. 11 is a block diagram illustrating an example wireless communication device in accordance with one or more implementations of the subject technology. Not all of the depicted components may be used in all implementations, however, one or more implementations may include additional or different components than those shown in the figure. Variations in the arrangement and type of the components may be made without departing from the spirit or scope of the claims as set forth herein. Additional components, different components, or fewer components may be provided.

The wireless communication device 1100 may comprise a radio-frequency (RF) antenna 1110, a receiver 1120, a transmitter 1130, a baseband processing module 1140, a memory 1150, a processor 1160, and a local oscillator generator (LOGEN) 1170. In various embodiments of the subject technology, one or more of the blocks represented in FIG. 11 may be integrated on one or more semiconductor substrates. For example, the blocks 1120-1170 may be realized in a single chip or a single system on chip, or may be realized in a multi-chip chipset.

The RF antenna 1110 may be suitable for transmitting and/or receiving RF signals (e.g., wireless signals) over a wide range of frequencies (e.g., 60 GHz band). Although a single RF antenna 1110 is illustrated, the subject technology is not so limited.

The receiver 1120 may comprise suitable logic circuitry and/or code that may be operable to receive and process signals from the RF antenna 1110. The receiver 1120 may, for example, be operable to amplify and/or down-convert received wireless signals. In various embodiments of the subject technology, the receiver 1120 may be operable to cancel noise in received signals and may be in close proximity to over a wide range of frequencies. In this manner, the receiver 1120 may be suitable for receiving signals in accordance with a variety of wireless standards. Wi-Fi, WiMAX, Bluetooth, and various cellular standards. In various embodiments of the subject technology, the receiver 1120 may not require any SAW filters and few or no off-chip discrete components such as large capacitors and inductors.

The transmitter 1130 may comprise suitable logic circuitry and/or code that may be operable to process and transmit signals from the RF antenna 1110. The transmitter 1130 may, for example, be operable to up-convert baseband signals to RF signals and amplify RF signals. In various embodiments of the subject technology, the transmitter 1130 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 1130 may be operable to provide signals for further amplification by one or more power amplifiers.

The duplexer 1112 may provide isolation in the transmit band to avoid saturation of the receiver 1120 or damaging parts of the receiver 1120, and to relax one or more design requirements of the receiver 1120. Furthermore, the duplexer 1112 may attenuate the noise in the receive band. The duplexer may be operable in multiple frequency bands of various wireless standards.

The baseband processing module 1140 may comprise suitable logic, circuitry, interfaces, and/or code that may be operable to perform processing of baseband signals. The baseband processing module 1140 may, for example, analyze received signals and generate control and/or feedback signals for configuring various components of the wireless communication device 1100 such as the receiver 1120. The baseband processing module 1140 may be operable to encode, decode, transcode, modulate, demodulate, encrypt, decrypt, scramble, descramble, and/or otherwise process data in accordance with one or more wireless standards. In some implementations, the baseband processing module 1140 can perform some or all the functionalities of the digital envelope detector 510, look-up table 520, scalers 530 of FIG. 5 and other digital processing used to implement digital functionalities of the fully integrated PA of the subject technology.

The processor 1160 may comprise suitable logic, circuitry, and/or code that may enable processing data and/or controlling operations of the wireless communication device 1100. In this regard, the processor 1160 may be enabled to provide control signals to various other portions of the wireless communication device 1100. The processor 1160 may also control transfers of data between various portions of the wireless communication device 1100. Additionally, the processor 1160 may enable implementation of an operating system or otherwise execute code to manage operations of the wireless communication device 1100.

The memory 1150 may comprise suitable logic, circuitry, and/or code that may enable storage of various types of information such as received data, generated data, code, and/or configuration information. The memory 1150 may comprise, for example, RAM, ROM, flash, and/or magnetic storage. In various embodiment of the subject technology, Information stored in the memory 1150 may be utilized for configuring the receiver 1120 and/or the baseband processing module 1140.

The local oscillator generator (LOGEN) 1170 may comprise suitable logic, circuitry, interfaces, and/or code that may be operable to generate one or more oscillating signals of one or more frequencies. The LOGEN 1170 may be operable to generate digital and/or analog signals. In this manner, the LOGEN 1170 may be operable to generate one or more clock signals and/or sinusoidal signals. Characteristics of the oscillating signals such as the frequency and duty cycle may be determined based on one or more control signals from, for example, the processor 1160 and/or the baseband processing module 1140.

In operation, the processor 1160 may configure the various components of the wireless communication device 1100 based on a wireless standard according to which it is desired to receive signals. Wireless signals may be received via the RF antenna 1110 and amplified and down-converted by the receiver 1120. The baseband processing module 1140 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 1150, and/or information affecting and/or enabling operation of the wireless communication device 1100. The baseband processing module 1140 may modulate, encode and perform other processing on audio, video, and/or control signals to be transmitted by the transmitter 1130 in accordance to various wireless standards.

In some embodiments, a PA of the RF transmitter 1130 can be implemented using the fully integrated PA of the subject technology to benefit from the enhanced power efficiency and other advantageous features of the disclosed technology.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A power amplifier (PA) circuit, the circuit comprising:
a first PA configured to amplify a first radio frequency (RF) signal, wherein the first PA is a fixed-bias PA;
a second PA configured to amplify a second RF signal, wherein the second PA is a variable-bias PA;
a first variable capacitor coupled between differential output nodes of the first PA; and
a second variable capacitor coupled between differential output nodes of the second PA,
wherein the first and the second RF signals are differential signals that are created by splitting a differential input RF signal, and wherein the differential output nodes of the first PA and the second PA are coupled via respective first and second transformers to a load, and capacitance values associated with the first and second variable capacitors are configured to be dynamically adjustable based on an amplitude of the RF signal to achieve a desired power efficiency at an output power level.

2. The circuit of claim 1, wherein the first PA comprises a carrier PA and is configured to deliver power to the load until the output power reaches a peak power level.

3. The circuit of claim 2, wherein, the second PA comprises a peaking PA and is configured to start delivering power to the load when the output power reaches a back-off output power level, and the back-off output power level is less than the peak power level.

4. The circuit of claim 1, further comprising an envelope detector configured to generate an envelope signal corresponding to the differential input RF signal, and a low-pass filter (LPF) configured to filter the envelope signal.

5. The circuit of claim 4, wherein the second PA comprises an adaptively biased PA and is configured to use the filtered envelope signal as an adaptive bias voltage, and the adaptive bias voltage enables turning the second PA off when an output power at the load is less than a back-off power level, wherein the back-off power level is about 6 dB below a peak power level.

6. The circuit of claim 4, further comprising multiple additional peaking PAs, each additional peaking PA having an associated variable capacitor coupled between differential output nodes of that additional peaking PA, wherein differential output nodes of each additional peaking PA are coupled via a corresponding transformer to the load, and wherein each additional peaking amplifier is associated with a variable bias voltage that changes with the envelope signal.

7. The circuit of claim 4, further comprising a first and a second voltage amplifier coupled to an output node of the LPF, and wherein the first and the second voltage amplifier are configured to allow their respective voltage gains to be set independently.

8. The circuit of claim 7, wherein the first and the second voltage amplifier are configured to dynamically adjust respective capacitances of the first and the second variable capacitors.

9. The circuit of claim 1, wherein the first and the second variable capacitors comprise a first bank and a second bank of switched capacitor.

10. The circuit of claim 9, further comprising a first and second capacitor tuning circuits configured to dynamically adjust respective capacitances of the first bank and the second bank of switched capacitors based on the filtered envelope signal, wherein the first and second capacitor tuning circuits comprise comparator-based circuits.

11. The circuit of claim 9, further comprising a baseband processor configured to generate a digital envelope signal based on the differential input RF signal.

12. The circuit of claim 11, wherein the baseband processor is further configured to filter and scale the digital envelope signal to generate digital control signals to dynamically adjust the respective capacitances of the first bank and the second bank of switched capacitors based on the digital envelope signal.

13. A transmitter circuit, comprising:
a baseband radio configured to generate a baseband signal; and
a radio frequency (RF) circuit configured to convert the baseband signal to an RF signal for transmission, the RF circuit including a power amplifier (PA) circuit comprising:
a fixed-bias PA configured to amplify a first RF signal;
a variable-bias PA configured to amplify a second RF signal;
a first adjustable capacitor coupled between differential output nodes of the fixed bias PA;
a second adjustable capacitor coupled between differential output nodes of the variable-bias PA; and
a first and a second transformer,
wherein the differential output nodes of the fixed-bias PA and the variable-bias PA are respectively coupled via the first and the second transformer to a load, and capacitance values associated with the first and second adjustable capacitors are configured to be dynamically adjustable to achieve a desired power efficiency at an output power level.

14. The circuit of claim 13, wherein the first and the second RF signals are differential signals that are created by splitting a differential input RF signal, and wherein the circuit further comprises an envelope detector configured to generate an envelope signal corresponding to the differential input RF signal, and a low-pass filter (LPF) configured to filter the envelope signal.

15. The circuit of claim 14, further comprising a first and second capacitor tuning circuits configured to dynamically adjust respective capacitances of a first bank and a second bank of switched capacitors based on the filtered envelope signal, wherein first and second capacitor tuning circuits comprise comparator-based circuits, and wherein the first and second adjustable capacitors are implemented as the first bank and the second bank of switched capacitors.

16. The circuit of claim 14, wherein the first and the second adjustable capacitors comprise a first bank and a second bank of switched capacitors, the circuit further comprises a first and a second voltage amplifier coupled to an output node of the LPF, and wherein the first and the second voltage amplifier are configured to dynamically adjust respective capacitances of the first bank and the second bank of switched capacitors based on the filtered envelope signal.

17. The circuit of claim 14, further comprising a baseband processor configured to generate a digital envelope signal based on the differential input RF signal, wherein the baseband processor is further configured to filter and scale the digital envelope signal to generate digital control signals to dynamically adjust the respective capacitances of the first bank and the second bank of switched capacitors based on the digital envelope signal.

18. A method comprising:
providing a power amplifier (PA) circuit by providing a first PA to amplify the first RF signal, wherein the first PA is a fixed-bias PA;

providing a second PA to amplify the second RF signal, wherein the second PA is a variable-bias PA;

coupling a first variable capacitor between differential outputs of the first PA;

coupling a second variable capacitor between differential output nodes of the second PA;

coupling the differential output nodes of the first PA and the second PA via respective first and second transformers to a load; and providing a control circuit to dynamically adjust capacitance values associated with the first and second variable capacitors to achieve a desired power efficiency at an output power level.

19. The method of claim 18, wherein the first and the second variable capacitors comprise a first bank and a second bank of switched capacitors, and the method further comprises providing the control circuit by providing a baseband processor to generate a digital envelope signal based on a differential input RF signal.

20. The method of claim 18, further comprising providing the control circuit by providing a baseband processor to filter and scale the digital envelope signal to generate digital control signals to dynamically adjust the respective capacitances of the first bank and the second bank of switched capacitors based on the digital envelope signal.

* * * * *